(12) United States Patent
Gurpinar et al.

(10) Patent No.: US 11,527,456 B2
(45) Date of Patent: Dec. 13, 2022

(54) POWER MODULE WITH ORGANIC LAYERS

(71) Applicant: UT-Battelle, LLC, Oak Ridge, TN (US)

(72) Inventors: Emre Gurpinar, Oak Ridge, TN (US); Md Shajjad Chowdhury, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 24 days.

(21) Appl. No.: 17/085,123

(22) Filed: Oct. 30, 2020

(65) Prior Publication Data
US 2021/0210477 A1    Jul. 8, 2021

Related U.S. Application Data

(60) Provisional application No. 62/928,669, filed on Oct. 31, 2019.

(51) Int. Cl.
| | |
|---|---|
| *H01L 25/18* | (2006.01) |
| *H01L 23/373* | (2006.01) |
| *H05K 7/20* | (2006.01) |
| *H01L 23/36* | (2006.01) |
| *H01L 23/498* | (2006.01) |

(52) U.S. Cl.
CPC .......... *H01L 23/36* (2013.01); *H01L 23/3735* (2013.01); *H01L 25/18* (2013.01); *H05K 7/209* (2013.01); *H01L 23/49866* (2013.01); *H01L 23/49894* (2013.01)

(58) Field of Classification Search
CPC ... H01L 23/34; H01L 23/3735; H01L 23/367; H01L 23/49866; H01L 23/49894; H01L 21/187; H01L 21/2007; H01L 24/33; H01L 25/072; H01L 27/0647; H01L 29/7302; H01L 29/66295; H05K 7/2039; H05K 7/20472; H05K 7/205; H05K 7/2089–209; H05K 7/2015; H05K 1/0201–0212; H05K 1/021; H05K 1/029; H05K 2201/066–068
See application file for complete search history.

(56) References Cited

U.S. PATENT DOCUMENTS

| | | | |
|---|---|---|---|
| 9,041,183 B2 | 5/2015 | Liang et al. | |
| 9,941,234 B2 | 4/2018 | Liang | |
| 2008/0305582 A1* | 12/2008 | Fillion | H01L 23/5385 438/118 |
| 2009/0039498 A1* | 2/2009 | Bayerer | H01L 23/3735 257/E23.173 |

(Continued)

FOREIGN PATENT DOCUMENTS

| | | | | |
|---|---|---|---|---|
| DE | 19605302 A1 * | 8/1997 | ............. | H01L 23/36 |
| EP | 0597144 A1 * | 5/1994 | .......... | H01I 23/3672 |

OTHER PUBLICATIONS

English Translation of EP-0597144-A1 (Year: 1994).*

(Continued)

*Primary Examiner* — Zachary Pape
*Assistant Examiner* — Amir A Jalali
(74) *Attorney, Agent, or Firm* — Warner Norcross + Judd LLP

(57) ABSTRACT

A power module is provided with reduced power and gate loop inductance. The power module may be configured in a multi-layer manner with one or more organic substrates.

25 Claims, 5 Drawing Sheets

(56) References Cited

U.S. PATENT DOCUMENTS

| | | | | |
|---|---|---|---|---|
| 2009/0257212 | A1* | 10/2009 | Takano | H01L 25/18 |
| | | | | 361/784 |
| 2015/0115288 | A1* | 4/2015 | Tamada | H01L 23/3736 |
| | | | | 257/77 |
| 2016/0233202 | A1* | 8/2016 | Komo | H01L 23/552 |
| 2018/0366400 | A1* | 12/2018 | Mohn | H01L 23/5383 |
| 2019/0287885 | A1* | 9/2019 | Joshi | H02M 3/158 |
| 2019/0304859 | A1* | 10/2019 | Otsubo | H01L 23/473 |
| 2020/0126946 | A1* | 4/2020 | Joshi | H01L 24/32 |

OTHER PUBLICATIONS

English Translation of DE-19605302 (Year: 1997).*

Gurpinar, E. et al., "Single-Phase T-Type Inverter Performance Benchmark Using Si IGBTs, SiC MOSFETs, and GaN HEMTs", IEEE Transactions on Power Electronics, vol. 31, No. 10, Oct. 2016, pp. 7148-7160.

Weidner, K. et al., "Planar Interconnect Technology for Power Module System Integration", 2012 7th International Conference on Integrated Power Electronics Systems (CIPS), Nuremberg, 2012, pp. 1-5.

Beckedahl, P. et al., "Breakthrough into the third dimension—Sintered multi layer flex for ultra low inductance power modules", CIPS 2014; 8th International Conference on Integrated Power Electronics Systems, Nuremberg, Germany, 2014, pp. 1-5.

Liang, Z., "Integrated double sided cooling packaging of planar SiC power modules", 2015 IEEE Energy Conversion Congress and Exposition (ECCE), Montreal, QC, 2015, pp. 4907-4912.

Yang, F. et al., "Electrical Performance Advancement in SiC Power Module Package Design with Kelvin Drain Connection and Low Parasitic Inductance", IEEE Journal of Emerging and Selected Topics in Power Electronics, vol. 7, No. 1, Mar. 2019, pp. 84-98.

Liang, Z. et al., "Development of Advanced All-SiC Power Modules", IEEE Transactions on Power Electronics, vol. 29, No. 5, May 2014, pp. 2289-2295.

Suganuma, K.,"Wide Bandgap Power Semiconductor Packaging: Materials, Components, and Reliability", textbook ch. 2: Interconnection technologies, and ch. 3: Substrate, published 2018, pp. 58-94.

https://web.archive.org/web/20200923220753/https:/indianaic.com/applications/, "Quilt Packaging Applications", available at least as of Oct. 30, 2020.

Aliyu, A.M. et al., "Prognostic System for Power Modules in Converter Systems Using Structure Function", published in IEEE Transactions on Power Electronics, vol. 33, Issue 1, Jan. 2018, pp. 1-27.

Chen, C. et al., "A Review of SiC Power Module Packaging: Layout, Material System and Integration", CPSS Transactions on Power Electronics and Applications, vol. 2, No. 3, Sep. 2017, pp. 170-186.

Stevanovic, L., "Packaging Challenges and Solutions for Silicon Carbide Power Electronics", presented at ECTC Panel Discussion: Power Electronics—A Booming Market, San Diego, May 29, 2012, pp. 1-13.

Hayes, M.B., "650V Silicon Carbide Integrated Power Module for Automotive Inverters", DOE VTO AMR 2018 Presentation, available at https://www.energy.gov/sites/prod/files/2018/06/f52/elt083_hayes_2018_o_.pdf, pp. 1-31.

* cited by examiner

POWER MODULE WITH ORGANIC LAYERS

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF INVENTION

The present disclosure relates to the field of power module packaging, and more particularly to packaging for a wide-band gap (WBG) power device-based power module.

BACKGROUND

Conventional wide-bandgap power devices (e.g., silicon carbide and gallium nitride) utilize a low inductance substrate layout where the inductance of the power and gate loops affects operation in cases were switching speeds are implemented. At the same time, high thermal performance is considered necessary due to small size and high power handling capability. In a conventional substrate layout, the gate driver integrated circuit (IC) is far from the device, which leads to very large gate loop inductance. And, a horizontal power loop is often used conventionally to form a half-bridge layout, which leads to large power loop inductance.

SUMMARY

In one embodiment, a module is provided with reduced power and gate loop inductance. The power module may be configured in a multi-layer manner with one or more organic substrates.

In general, one innovative aspect of the subject matter described herein can be a power module comprising a WBG power device including a DC+ input terminal to receive a positive-voltage from a DC power source during operation of the WBG power device, a DC− input terminal to receive a negative-voltage from the DC power source during the operation of the WBG power device, and an output terminal to provide an output signal to an electrical load during the operation of the WBG power device. The power module may include a heat sink and a substrate disposed between the WBG power device and the heat sink, where the substrate includes a plurality of metal layers comprising a first metal layer, a second metal layer, and a third metal layer.

The second metal layer may be disposed between the first metal layer and the third metal layer, where one of the DC+ input terminal and the DC− input terminal is electrically connected to the first metal layer, where the other one of the DC+ input terminal and the DC− input terminal is electrically connected to the second metal layer, where the output terminal is electrically connected to either the first metal layer or the second metal layer, and where the heat sink is thermally connected to the third metal layer.

The power module may include two films sandwiched between the metal layers, the two films including an organic material, where the organic material is configured to cause the two films to electrically insulate the three metal layers from each other, and the organic material is configured to cause the two films to conduct heat, emitted during the operation of the WBG power device, through the substrate from the WBG power device to the heat sink.

The foregoing and other embodiments can each optionally include one or more of the following features, alone or in combination. In particular, one embodiment includes all the following features in combination.

In some embodiments, the power module may include a WBG power device where the metal layers comprise Cu.

In some embodiments, the power module may include a WBG power device where the first metal layer comprises pyrolytic graphite embedded in Cu.

In some embodiments, the power module may include a WBG power device where the substrate includes one or more metal vias arranged and configured to form a portion of an electrical path between the second metal layer and the one of the DC+ input terminal and the DC− input terminal that is electrically connected to the first metal layer.

In some embodiments, the power module may include a WBG power device where the heat sink includes a base connected to the third metal layer, and where the heat sink includes fins extending away from the substrate.

In some embodiments, the power module may include a WBG power device where the WBG power device includes a half-bridge module disposed on the substrate. The half-bridge module may include a first SiC MOSFET connected between the DC+ input terminal and the output terminal, and may include a second SiC MOSFET connected between the output terminal and the DC− input terminal.

In some embodiments, the power module may include a WBG power device where the WBG power device includes first gate driver circuitry disposed on the substrate and connected to a first gate of the first SiC MOSFET and second gate driver circuitry disposed on the substrate and connected to a second gate of the second SiC MOSFET.

In general, one innovative aspect of the subject matter described herein can be a power module comprising a heat exchanger and a WBG power device, where the WBG power device includes a DC+ input terminal to receive a positive-voltage from a DC power source and a DC− input terminal to receive a negative-voltage from the DC power source. The WBG power device may include an output terminal to provide an output signal to an electrical load. The power module may include a substrate disposed between the WBG power device and the heat exchanger, where the substrate includes an organic layer disposed between the WBG power device and the heat exchanger.

The foregoing and other embodiments can each optionally include one or more of the following features, alone or in combination. In particular, one embodiment includes all of the following features in combination.

In some embodiments, the power module may include a WBG power device where the heat exchanger is directly bonded to the organic layer.

In some embodiments, the power module may include a WBG power device where the substrate includes a first metal layer.

In some embodiments, the power module may include a WBG power device where the first metal layer is directly bonded to a heat sink portion of the heat exchanger.

In some embodiments, the power module may include a WBG power device where the first metal layer is integral to the heat exchanger such that the first metal layer and the heat exchanger forms an integral one-piece heat exchanger.

In some embodiments, the power module may include a WBG power device where the substrate includes a second metal layer electrically connected to the WBG power device, where the organic layer is disposed between the first metal layer and the second metal layer, and where the second metal layer is disposed between the WBG power device and the heat exchanger.

In some embodiments, the power module may include a WBG power device where the organic layer is a first organic layer. The substrate may include a second organic layer and a third metal layer that is electrically connected to the WBG power device, where the second organic layer is between the second metal layer and the third metal layer.

In some embodiments, the power module may include a WBG power device where the WBG power device is electrically connected to the second metal layer via one or more electrical vias between the third metal layer and the second metal layer.

In some embodiments, the power module may include a WBG power device where one of the DC+ input terminal and the DC− input terminal is electrically connected to the third metal layer, the other one of the DC+ input terminal and the DC− input terminal is electrically connected to the second metal layer, and the output terminal is electrically connected to either the third metal layer or the second metal layer.

In some embodiments, the power module may include a WBG power device where the first and second organic layers are films including an organic material configured to cause the first and second organic layers to facilitate conduction of heat, emitted during operation of the WBG power device, to the heat exchanger.

In some embodiments, the power module may include a WBG power device where the substrate includes a metal layer, and where the metal layer includes Cu.

In some embodiments, the power module may include a WBG power device where the metal layer includes pyrolytic graphite embedded in Cu.

In some embodiments, the power module may include a WBG power device where the heat exchanger includes fins extending away from the substrate.

In some embodiments, the power module may include a WBG power device where the organic layer is a thermally conductive plastic layer.

In general, one innovative aspect of the subject matter described herein can be a power module comprising a heat exchanger and a WBG power device, where the WBG power device includes a DC+ input terminal to receive a positive-voltage from a DC power source, a DC− input terminal to receive a negative-voltage from the DC power source, and an output terminal to provide an output signal to an electrical load.

The power module may include a substrate disposed between the WBG power device and the heat exchanger, where the substrate includes an organic layer disposed between the WBG power device and the heat exchanger, where the organic layer is bonded to the heat exchanger.

The foregoing and other embodiments can each optionally include one or more of the following features, alone or in combination. In particular, one embodiment includes all the following features in combination.

In some embodiments, the power module may include a WBG power device where the substrate includes a first metal layer electrically connected to the WBG power device, where the organic layer is disposed between the heat exchanger and the first metal layer, and where the first metal layer is disposed between the WBG power device and the heat exchanger.

In some embodiments, the power module may include a WBG power device where the organic layer is a first organic layer. The substrate may include a second organic layer and a second metal layer that is electrically connected to the WBG power device, where the second organic layer is between the first metal layer and the second metal layer.

In some embodiments, the power module may include a WBG power device where the WBG power device is electrically connected to the first metal layer via one or more electrical vias between the first metal layer and the second metal layer.

In some embodiments, the power module may include a WBG power device where the heat exchanger includes a metal layer portion and a heat sink portion.

In some embodiments, the power module may include a WBG power device where the metal layer portion and the heat sink portion are integral to form a one-piece integral heat sink.

In some embodiments, the power module may include a WBG power device where the heat sink portion is directly bonded to the metal layer portion via a bonding interface of the heat sink portion.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DETAILED DESCRIPTION

A power module is provided in accordance with one embodiment with reduced power and gate loop inductance. The power module may be configured in a multi-layer manner with one or more organic substrates.

Figure 1:
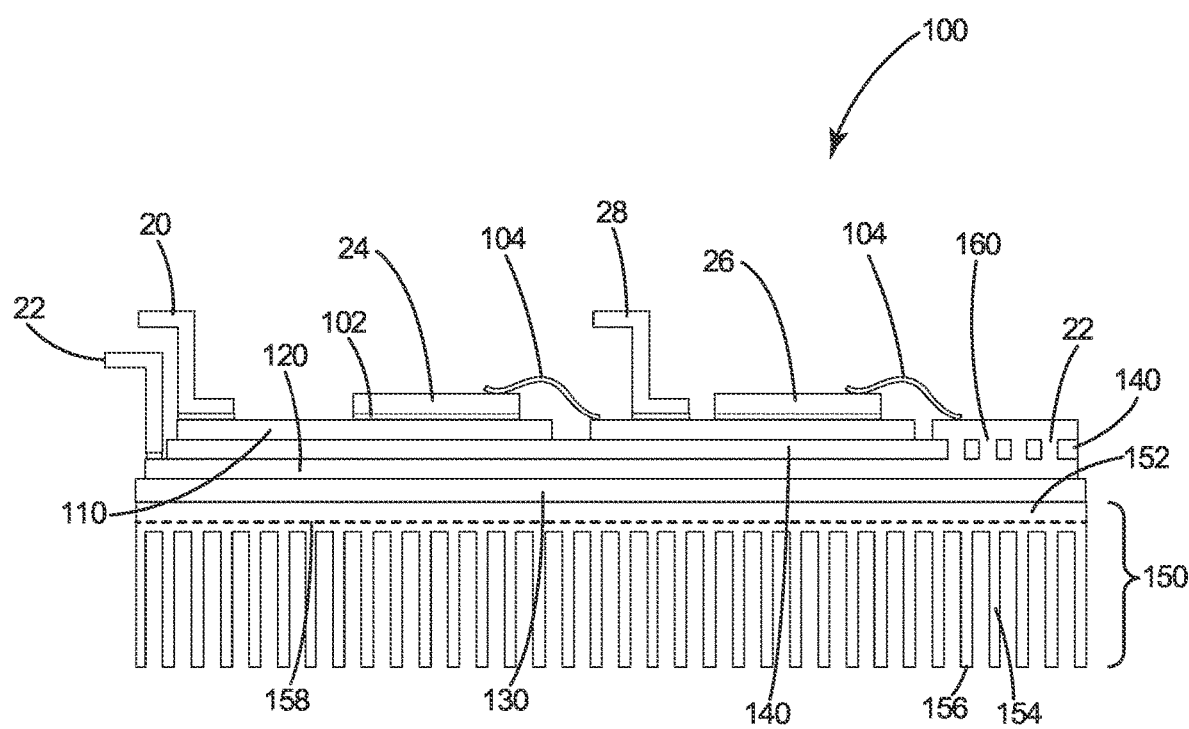
FIG. 1 shows a power module in accordance with one embodiment.
Figure 4:
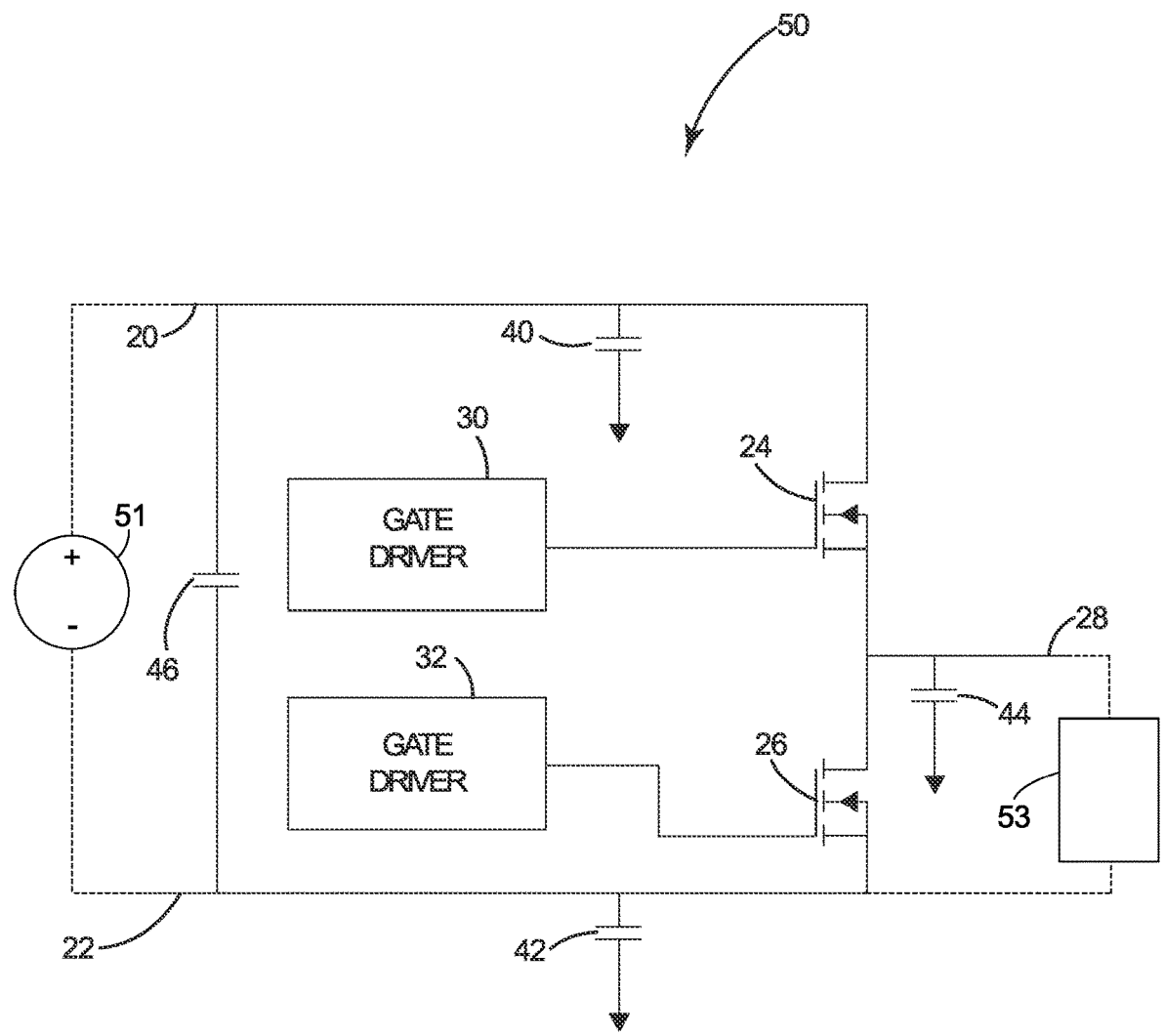
FIG. 4 shows a switching circuit in accordance with one embodiment of the present disclosure.

A power module provided in accordance with one embodiment for switching circuitry 50 is shown in FIGS. 1 and 4 and generally designated 100. Connections and components of the switching circuitry 50 in one embodiment are shown in further detail in FIG. 4, and include at least one switch, such as a WBG device.

In the illustrated embodiment, the switching circuitry 50 includes a first switch 24 and a second switch 26 arranged in a half-bridge configuration with first and second gate drivers 30, 32 coupled respectively to the first and second switches 24, 26. In the half-bridge configuration, the first switch 24 is the top, upper, or high-side switch, and the second switch 26 is the bottom, lower, or low-side switch. Although the first switch 24 is shown as a single switch, it is to be understood that multiple switches may be provided in the circuitry to provide the functionality of the first switch 24, such as multiple switches provided in parallel with each other to provide high-side switching functionality in a half-bridge configuration. The functionality of the second switch 26 also may be achieved via more than one switch, such as multiple switches in parallel. A multiple switch configuration can be seen in the illustrated embodiment of FIG. 3, with the multiple switches 24 designated by A and B designations, and the multiple switches 26 designated by A and B designations.

The first and second gate drivers 30, 32 may include circuitry for controlling the first and second switches 24, 26 and may provide external connections to enable external circuitry (not shown) to control operation of the first and second switches 24, 26. In one embodiment, the circuitry of the first and second gate drivers 30, 32 may be conductors that provide an electrical path between external circuitry and respective gates of the first and second switches 24, 26. The switching circuitry 50 in the illustrated embodiment is configured to receive power from a DC power bus (e.g., a DC power source 51) via a DC positive terminal 20 and a DC negative terminal 22. Power provided to the switching circuitry 50 may vary depending on the application and is not limited to DC power.

The switching circuitry 50 may include capacitance that is inherent to the circuit or provided via a discrete capacitor, or a combination thereof. In the illustrated embodiment, the switching circuitry 50 includes a DC link capacitor 46 and parasitic capacitance 40, 42.

The switching circuitry 50 in the illustrated embodiment includes an output terminal 28 connected to the outputs of the first and second switches 24, 26. The output terminal 28, by virtue of the connection to the first and second switches 24, 26, may be coupled to the common mode capacitance 44 associated with the first and second switches 24, 26. The common mode capacitance 44 may correspond to the intrinsic capacitance formed by the substrate in conjunction with the switching circuitry 50. For example, when the first switch 24 (e.g., a WBG device) is attached to a first metal layer 110 and isolated from a second metal layer 120 with a dielectric, a parasitic capacitance is formed between the bottom of the first switch 24 (e.g., the drain terminal in this case) and the second metal layer 120. If the bottom of the first switch 24 is connected to the output terminal 28 and the second metal layer 120 is connected to the heat sink portion 154 (e.g., ground), a parasitic capacitance may be formed between output terminal 28 and the ground.

As described herein, the terms first, second, and third are used in conjunction with the first, second, and third metal layers 110, 120, 150, and the terms first and second are used in conjunction with the first and second films 140, 130. It is to be understood that these terms are provided for purposes of disclosure to facilitate differentiation between the metal layers 110, 120, 150 and between the films 140, 130 and are not intended to designate specific positions or locations of the layers or films within the power module 100. For instance, the term first may be used with the first metal layer 110, and the term third may be used with the third metal layer 120; however, the first metal layer 110 may be described alternatively as a third metal layer 110 with the third metal layer 150 being alternatively described as the first metal layer 150 to be consistent with the terms first, second, and third being used to facilitate differentiation between the metal layers 110, 120, 150.

The first and second switches 24, 26 in one embodiment may form a half-bridge configuration with SiC MOSFETs (e.g., 10 mΩ, 900V), and the switching circuitry 50 may include associated gate driver circuitry 30, 32, a DC link capacitor 46 and power terminals 20, 22.

The power module 100 may be configured to provide enhanced performance over conventional packages, such as by providing low commutation loop inductance over conventional packages.

The power module 100 in the illustrated embodiment packages the switching circuitry 50 in a manner that reduces power and gate loop inductance, potentially minimizing the power and gate loop inductance. The power module 100 may provide packaging for the switching circuitry 50 with multiple layers including at least one organic substrate.

The power module 100 in the illustrated embodiment includes a multi-layer organic substrate-based layout with first and second switches 24, 26 in the form of WBG devices in order to form a WBG power device-based power module. As described herein, in one embodiment, the power module 100 includes organic direct bonded copper (ODBC) and thermally annealed pyrolytic graphite (TPG) embedded ODBC for a WBG power device-based power module.

In the illustrated embodiment, the power module 100 is configured with a vertical layout such that the switching circuitry 50 is provided with low commutation loop inductance. For instance, the vertical layout may include a 3-layer structure where each copper layer is insulated with an organic dielectric film material.

The power module 100 in the illustrated embodiment of FIG. 1 includes a plurality of metal layers, including a first metal layer 110 and a second metal layer 120. The first and second metal layers 110, 120 may include one or more materials, such as copper or another type of conductive material and pyrolytic graphite. The one or more materials that form the first and second metal layers 110, 120 may vary from application to application, and may include a non-metal material or a non-conductive material, or a combination thereof. Accordingly, one or more of the plurality of metal layers may not be formed entirely of metal.

The first and second metal layers 110, 120 are coupled to a first film 140, which is formed of an organic material in an illustrated embodiment, that may electrically insulate the first metal layer 110 from the second metal layer 120. The first metal layer 110 and the first film 140, together or in conjunction with one or more additional layers and films, may define a substrate on which one or more components of the switching circuitry 50 are disposed. The first metal layer 110 and the first film 140 may be bonded. Example bonding materials or methods include soldering, sintering, direct bonding, and an adhesive. The first film 140 may also be bonded to the second metal layer 120 in a manner similar to the bonding between the first metal layer 110 and the first film 140.

Figure 5:
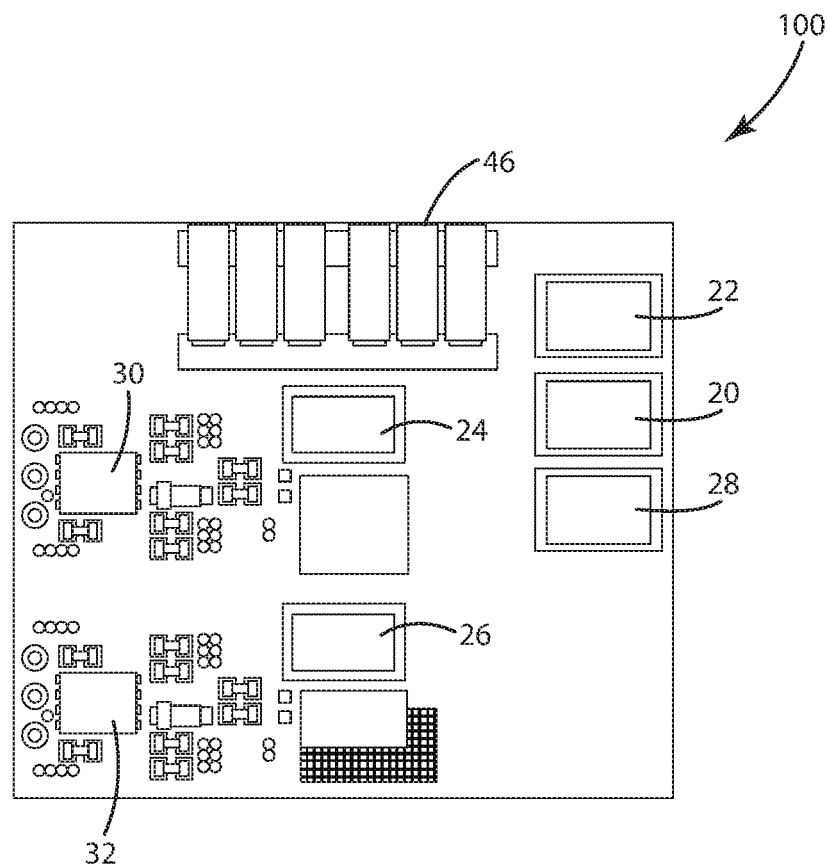
FIG. 5 is a top view of the power module in accordance with one embodiment.
Figure 6:
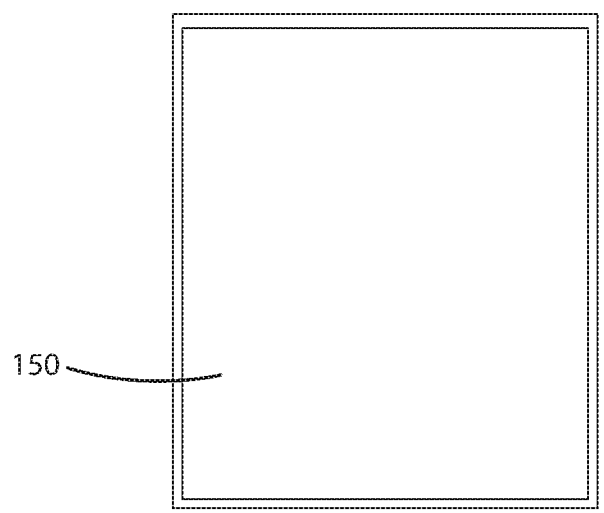
FIG. 6 shows a partially exploded view of the power module of FIG. 5.
Figure 6:
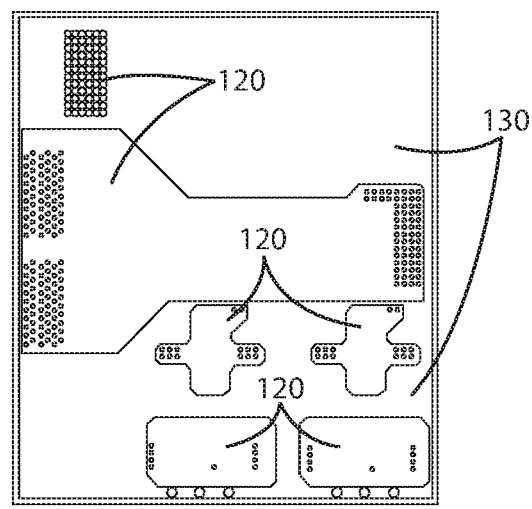
Figure 6:
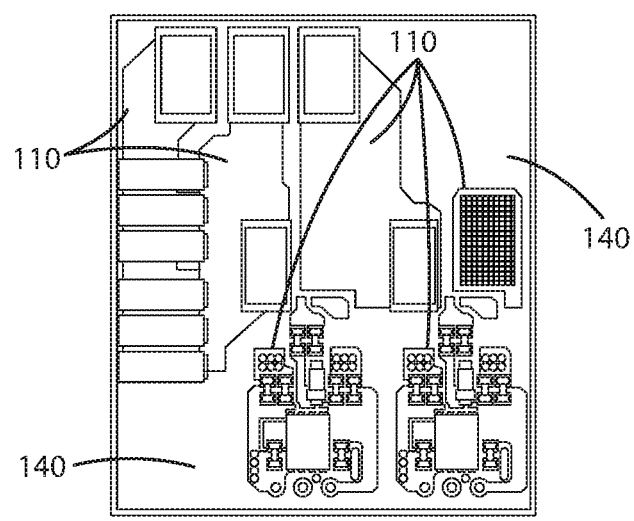

In the illustrated embodiment, the first and second switches 24, 26 may be soldered to the first metal layer 110 via solder 102. The first and second switches 24, 26 may include terminals that are coupled to one or more portions of the first metal layer 110 via wire 104 (e.g., aluminum wire). It is noted that the first metal layer 110 and the second metal layer 120 may include portions electrically isolated from each other (such as by a gap in the layer) but disposed in the same plane or layer. For instance, the first metal layer 110 in the illustrated embodiment includes a portion electrically coupled to the DC positive terminal 20 and another portion electrically coupled to the output terminal 28. These various portions of the first and second metal layers 110, 120 can be seen in the illustrated embodiment of FIGS. 5 and 6, which show a top view of the power module 100 in one embodiment and portions of the power module 100 separate from each other. The size of the substrate, shown in FIG. 6 without the components of the switching circuitry 50, is 43 mm×38 mm and may be determined based on detailed finite-element modelling and analysis. The top, inner, and bottom layers are presented separately in FIG. 6 as discussed herein. The top layer includes the first metal layer 110 and the first film 140, the inner layer includes the second metal layer 120 and the second film 130, and the bottom layer includes the metal layer 150.

A second film 130 is provided in one embodiment and coupled (e.g., bonded) to the second metal layer 120. The first metal layer 110, the second metal layer 120, the second film 130, and the first film 140 may define the substrate on which one or more components of the switching circuitry 50 are disposed. For instance, both the first and second switches 24, 26 may be disposed on the substrate defined by the first metal layer 110, the second metal layer 120, the second film 130, and the first film 140.

A third metal layer 150 is provided in one embodiment and coupled to the second film 130, similar to the coupling between the second film 130 and the second metal layer 120. The third metal layer 150 may include a metal layer portion 152 and a heat sink portion 154. The third metal layer 150 may operate as a heat exchanger. In the illustrated embodiment, the metal layer portion 152 and the heat sink portion 154 are integral such that the third metal layer 150 provides an integral one-piece heat sink and metal layer bonded to the second film 130. Optionally, the heat sink portion 154 may be separate from but bonded to the metal layer portion 152 via a bonding interface 158. In the illustrated embodiment, the heat sink portion 154 includes a plurality of fins 156 that facilitate dissipation of heat via convection. The fins 156 may extend away from the substrate defined by the first and second metal layers 110, 120 and the first and second films 140, 130.

As discussed herein, the first and second films 140, 130 may electrically insulate metal layers respectively coupled to the first and second films 140, 130. With respect to heat, however, the first and second films 140, 130 may be thermally conductive and allow conduction of heat from one or more components of the switching circuitry 50 to the heat sink portion 154 of the third metal layer 150. The first and second films 140, 130, as described herein, may be formed of organic material that is heat conductive and an electrical insulator.

In one embodiment, the connection between layers of the power module 100 is provided through power vias 160. For instance, a portion of the second metal layer 120 may be coupled to the DC negative terminal 22 may be disposed directly beneath 1) a portion of the first metal layer 110 that is coupled to the DC positive terminal 20, 2) a portion of the first metal layer 110 that is coupled to the output terminal 28, and 3) the first and second switches 24, 26 (e.g., MOSFETs). This configuration of the second metal layer 120 and the first metal layer 110 may provide a low inductance layout with inherent electromagnetic interference (EMI) shielding from the heat sink portion 154. The power vias 160 in the illustrated embodiment may facilitate providing electrical communication between the DC negative terminal 22 and negative terminals of the first and second switches 24, 26.

In one embodiment, at least one of the plurality of metal layers is directly bonded to the heat sink portion 154 by providing an additional ODBC layer (e.g., the second film 130) for electrical insulation. This configuration can eliminate an interface layer between a substrate and a heat sink that is used in conventional architectures.

In one embodiment of the present disclosure, gate driver circuitry 30, 32 is provided on a substrate of the layers to enhance the gate loop inductance and integration. For instance, the gate driver circuitry 30, 32 may include passive components, integrated circuits to charge and discharge gate capacitance, and additional protection circuits to turn-off devices during fault conditions.

In one embodiment, the power module 100 is configured such it that can be integrated into a high power density power electronic converter (e.g., an automotive traction drive system) as it provides low commutation loop inductance for both power and gate loops, which can lead to increased switching performance and better utilization of WBG device properties.

The power module 100 may include a vertical loop that provides EMI shielding within the power module 100 to substantially avoid EMI related issues due to high switching speed of switching circuitry 50 with WBG devices as the first and second switches 24, 26.

In one embodiment, direct integration of the heat sink portion 154 into a metal layer of the power module 100 may eliminate additional layers present in a conventional thermal network, and leads to enhanced reliability and thermal performance relative to sizing of a multi-material stack.

Figure 2:
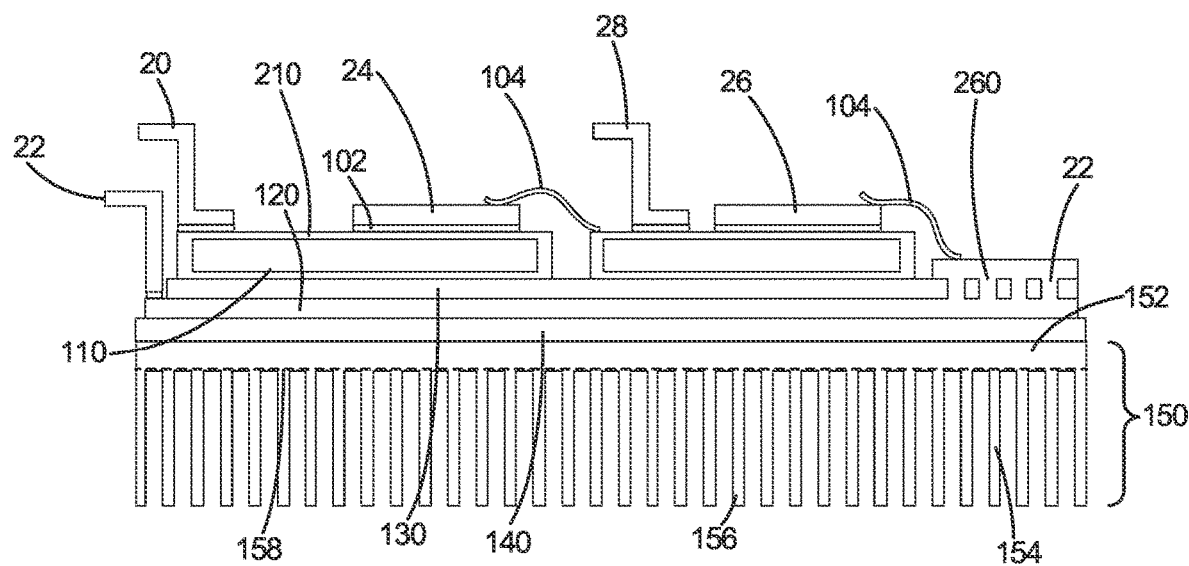
FIG. 2 shows a power module in accordance with another embodiment, and which is a sectional view of the power module shown in FIG. 3.
Figure 3:
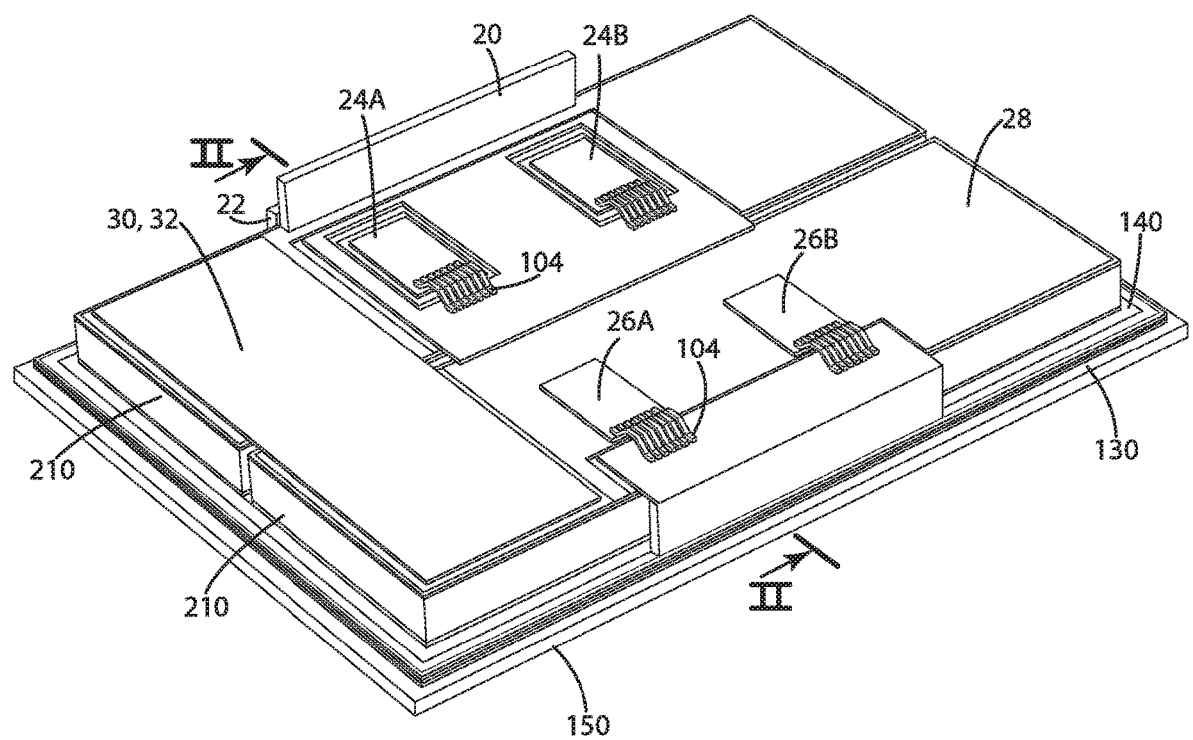
FIG. 3 shows a power module in accordance with one embodiment.

In an alternative embodiment, shown in FIGS. 2 and 3, a power module 200 is provided with a layer having one or more portions formed of embedded TPG. The power module 200 is constructed similar to the power module 100 with components configured similar to the power module 100 having the same reference numbers. For instance, the power module 200 in the illustrated embodiment includes a metal layer 150 having a heat sink portion and a metal layer portion 152 coupled to a second film 130, which is coupled to a second metal layer 120.

The first metal layer 210 of the power module 200 is constructed differently from the first metal layer 110 of the power module 100, and includes portions that are formed of an embedded TPG. For instance, portions of the first metal layer 110 that are electrically coupled respectively to the DC positive terminal 20 and the output terminal 28 include a TPG core. A portion of the first metal layer 210 is provided for power vias 260 and enabling an electrical connection to the DC negative terminal 22 coupled to the second metal layer. This portion does not include a TPG core in the illustrated embodiment. The illustrated embodiment of FIG. 3 does not show the heat sink portion 154 for purposes of disclosure; however, it is to be understood that the heat sink portion 154 may be present and coupled to the metal layer 150.

In one embodiment, with an embedded TPG provided in the first metal layer 210, heat flux generated by the power devices (e.g., the switching circuitry 50) can be spread in a lateral direction in an effective way, thereby further enhancing thermal performance.

The power module 100 in accordance with one embodiment of the present disclosure may be used in a variety of applications, including but not limited to automotive traction systems, solar inverters, and high performance—high power density power electronic converters.

In one embodiment, the power module 100 is provided for use in a power converter. The power module 100 may be responsible for processing and transferring electrical power between a source and a load 53 coupled electrically to the output terminal 28 with a target level of performance. The efficiency of the power module 100 may be considered high due to recent advancements in silicon-based power semiconductor devices, potentially above 90% for systems rated more than 1 kW output power. With the advancements in WBG based power semiconductor devices as the first and second switches 24, 26, such as SiC MOSFET and GaN HEMT, efficiency figures for the switching circuitry 50 on the power module 100 may be above 98%. However, even with high efficiency figures, a significant amount of power can be dissipated in a relatively small area due to increased power demand from the electrical load 53 on the output terminal 28, increased power density of the power module 100, and reduced chip size of the first and second switches 24, 26, such as with the introduction of a WBG device as the first and second switches 24, 26. The performance of the materials used for packaging of the power module 100, integration and design of thermal management of the power module 100 in accordance with one embodiment may enable effective operation in a variety of domains, such as electric vehicles.

For instance, with a WBG device used for the first and second switches 24, 26, the power module 100 may be configured to operate at much higher switching speed and the impact of parasitic components (e.g., parasitic inductance) introduced by the module design may be reduced for optimizing system efficiency and enhancing benefits of the high speed switching devices.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. A power module comprising:
   a wide-band gap (WBG) power device including:
   a DC+ input terminal to receive a positive-voltage from a DC power source during operation of the WBG power device,
   a DC− input terminal to receive a negative-voltage from the DC power source during the operation of the WBG power device, and
   an output terminal to provide an output signal to an electrical load during the operation of the WBG power device;
   a heat sink; and
   a substrate disposed between the WBG power device and the heat sink, the substrate including a plurality of metal layers comprising a first metal layer, a second metal layer, and a third metal layer, the second metal layer being disposed between the first metal layer and the third metal layer,
   wherein one of the DC+ input terminal and the DC− input terminal is electrically connected to the first metal layer,
   wherein the other one of the DC+ input terminal and the DC− input terminal is electrically connected to the second metal layer,
   wherein a first portion of the first metal layer includes pyrolytic graphite embedded in Cu and is directly coupled to the one of the DC+ input terminal and the DC− input terminal, wherein the first portion is above a second portion of the second metal layer,
   wherein the output terminal is electrically connected to either the first metal layer or the second metal layer, and
   wherein the heat sink is thermally connected to the third metal layer, and
   two films sandwiched between the metal layers, the two films including an organic material, the organic material configured to cause the two films to electrically insulate the three metal layers from each other, the organic material configured to cause the two films to conduct heat, emitted during the operation of the WBG power device, through the substrate from the WBG power device to the heat sink.

2. The power module of claim 1, wherein the second and third metal layers comprise Cu.

3. The power module of claim 1, wherein the substrate includes one or more metal vias arranged and configured to form a portion of an electrical path between the second metal layer and the one of the DC+ input terminal and the DC− input terminal that is electrically connected to the first metal layer.

4. The power module of claim 1, wherein the heat sink includes a base connected to the third metal layer, and wherein the heat sink includes fins extending away from the substrate.

5. The power module of claim 1, wherein:
   the WBG power device includes a half-bridge module disposed on the substrate; and the half-bridge module includes:
    a first SiC MOSFET connected between the DC+ input terminal and the output terminal; and
    a second SiC MOSFET connected between the output terminal and the DC− input terminal.

6. The power module of claim 5, wherein the WBG power device includes:
    first gate driver circuitry disposed on the substrate and connected to a first gate of the first SiC MOSFET; and
    second gate driver circuitry disposed on the substrate and connected to a second gate of the second SiC MOSFET.

7. A power module comprising:
    a heat exchanger;
    a wide-band gap (WBG) power device, the WBG power device including:
    a DC+ input terminal to receive a positive-voltage from a DC power source;
    a DC− input terminal to receive a negative-voltage from the DC power source;
    an output terminal to provide an output signal to an electrical load; and a substrate disposed between the WBG power device and the heat exchanger, the substrate including an organic layer disposed between the WBG power device and the heat exchanger, the substrate including a first metal layer and a second metal layer,
    wherein one of the DC+ input terminal and the DC− input terminal is electrically connected to the first metal layer of the substrate,
    wherein the other one of the DC+ input terminal and the DC− input terminal is electrically connected to the second metal layer of the substrate, and
    wherein a first portion of the first metal layer includes pyrolytic graphite embedded in Cu and is directly coupled to the one of the DC+ input terminal and the DC− input terminal, wherein the first portion is above a second portion of the second metal layer.

8. The power module of claim 7 wherein the heat exchanger is directly bonded to the organic layer.

9. The power module of claim 7 wherein the substrate includes a third metal layer.

10. The power module of claim 9 wherein the third metal layer is directly bonded to a heat sink portion of the heat exchanger.

11. The power module of claim 9 wherein the third metal layer is integral to the heat exchanger such that the third metal layer and the heat exchanger form an integral one-piece heat exchanger.

12. The power module of claim 9 wherein the second metal layer is electrically connected to the WBG power device, wherein the organic layer is disposed between the third metal layer and the second metal layer, and wherein the second metal layer is disposed between the WBG power device and the heat exchanger.

13. The power module of claim 12 wherein:
    the organic layer is a first organic layer;
    the substrate includes a second organic layer;
    the first metal layer is electrically connected to the WBG power device; and
    the second organic layer is between the second metal layer and the first metal layer.

14. The power module of claim 13 wherein the WBG power device is electrically connected to the second metal layer via one or more electrical vias between the first metal layer and the second metal layer.

15. The power module of claim 14 wherein the output terminal is electrically connected to either the third metal layer or the second metal layer.

16. The power module of claim 14 wherein the first and second organic layers are films including an organic material configured to cause the first and second organic layers to facilitate conduction of heat, emitted during operation of the WBG power device, to the heat exchanger.

17. The power module of claim 7 wherein the heat exchanger includes fins extending away from the substrate.

18. The power module of claim 7 wherein the organic layer is a thermally conductive plastic layer.

19. A power module comprising:
    a heat exchanger;
    a wide-band gap (WBG) power device, the WBG power device including:
    a DC+ input terminal to receive a positive-voltage from a DC power source;
    a DC− input terminal to receive a negative-voltage from the DC power source;
    an output terminal to provide an output signal to an electrical load; and a substrate disposed between the WBG power device and the heat exchanger, the substrate including an organic layer disposed between the WBG power device and the heat exchanger, the organic layer being bonded to the heat exchanger, the substrate including a first metal layer and a second metal layer,
    wherein one of the DC+ input terminal and the DC− input terminal is electrically connected to the first metal layer of the substrate,
    wherein the other one of the DC+ input terminal and the DC− input terminal is electrically connected to the second metal layer of the substrate, and
    wherein a first portion of the first metal layer includes pyrolytic graphite embedded in Cu and is directly coupled to the one of the DC+ input terminal and the DC− input terminal, wherein the first portion is above a second portion of the second metal layer.

20. The power module of claim 19 wherein the first metal layer is electrically connected to the WBG power device, wherein the organic layer is disposed between the heat exchanger and the first metal layer, and wherein the first metal layer is disposed between the WBG power device and the heat exchanger.

21. The power module of claim 20 wherein:
    the organic layer is a first organic layer;
    the substrate includes a second organic layer;
    the second metal layer is electrically connected to the WBG power device; and
    the second organic layer is between the first metal layer and the second metal layer.

22. The power module of claim 21 wherein the WBG power device is electrically connected to the first metal layer via one or more electrical vias between the first metal layer and the second metal layer.

23. The power module of claim 19 wherein the heat exchanger includes a metal layer portion and a heat sink portion.

24. The power module of claim 23 wherein the metal layer portion and the heat sink portion are integral to form a one-piece integral heat sink.

25. The power module of claim 23 wherein the heat sink portion is directly bonded to the metal layer portion via a bonding interface of the heat sink portion.

* * * * *